(12) United States Patent
Ziger et al.

(10) Patent No.: US 7,709,166 B2
(45) Date of Patent: *May 4, 2010

(54) MEASURING THE EFFECT OF FLARE ON LINE WIDTH

(75) Inventors: David Ziger, San Antonio, TX (US); Pierre Leroux, San Antonio, TX (US)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/464,731

(22) Filed: May 12, 2009

(65) Prior Publication Data

US 2009/0220870 A1 Sep. 3, 2009

Related U.S. Application Data

(63) Continuation of application No. 10/566,804, filed as application No. PCT/IB2004/002444 on Jul. 31, 2004, now Pat. No. 7,556,900.

(60) Provisional application No. 60/492,130, filed on Aug. 1, 2003.

(51) Int. Cl.
*G03C 5/00* (2006.01)
*G03F 1/00* (2006.01)
*G03F 9/00* (2006.01)

(52) U.S. Cl. .............................. 430/30; 430/5; 430/22
(58) Field of Classification Search .................... 430/5, 430/30, 22
See application file for complete search history.

(56) References Cited

U.S. PATENT DOCUMENTS

2002/0182516 A1* 12/2002 Bowes ........................... 430/5
2003/0068565 A1* 4/2003 Ki et al. ......................... 430/5

* cited by examiner

*Primary Examiner*—Mark F Huff
*Assistant Examiner*—Jonathan Jelsma

(57) ABSTRACT

In photo-lithography, one may assess the effect of flare due to various exposure tools. In an example embodiment, in a photo-lithography process on a photo resist coated substrate, there is a method for determining the effect of flare on line shortening. The method comprises, at a first die position on the substrate and in a first exposure, printing a first mask that includes a flare pattern corresponding to one corner of the first mask, and in a second exposure, printing a second mask that includes another flare pattern corresponding to an opposite corner of the second mask. At a second die position on the substrate, a composite mask pattern based on features of the first mask and the second is printed. The printed patterns are developed and measurements are obtained therefrom. The effect of flare is determined as a function of the measurements.

13 Claims, 8 Drawing Sheets

MEASURING THE EFFECT OF FLARE ON LINE WIDTH

RELATED PATENT DOCUMENTS

This patent document is a continuation under 35 U.S.C. §120 of U.S. patent application Ser. No. 10/566,804 filed on Jan. 30, 2006, now U.S. Pat. No. 7,556,900 which is a 35 U.S.C. §371 national stage entry of International Application No. PCT/IB2004/02444 filed on Jul. 31, 2004 which claims priority benefit under 35 U.S.C. §119 of U.S. Application No. 60/492,130 filed on Aug. 1, 2003 to which priority is also claimed here.

The invention relates to semiconductor process. More particularly the invention relates to measuring the degree of flare distortion of printed features.

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, BiCMOS transistors.

Each of these semiconductor devices generally includes a semiconductor substrate on which a number of active devices are formed. The particular structure of a given active device can vary between device types. For example, in MOS transistors, a active device generally includes source and drain regions and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photo resist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

Often desired features have particular regions in which the final printed and etched regions have to be accurately reproduced over time. These are referred to as critical dimensions (CDs). As device geometry approaches the sub-micron realm, wafer fabrication becomes more reliant on maintaining consistent CDs over normal process variations. The active device dimensions as designed and replicated on the photo mask and those actually rendered on the wafer substrate have to be repeatable and controllable. In many situations, the process attempts to maintain the final CDs equal to the masking CDs. However, imperfections in the process or changes in technology (that may be realized in a given fabrication process, if the process were "tweaked") often necessitate the rendering of final CDs that deviate from the masking CDs.

U.S. Pat. No. 5,757,507 of Ausschnitt et al. relates generally to manufacturing processes requiring lithography and, more particularly, to monitoring of bias and overlay error in lithographic and etch processes used in microelectronics manufacturing which is particularly useful more monitoring pattern features with dimensions on the order of less than 0.5 micron.

U.S. Pat. No. 5,962,173 of Leroux et al. relates generally to the field of fabricating integrated circuits and more particularly to maintaining accuracy in the fabrication of such circuits having extremely narrow line elements such as gate lines.

U.S. Pat. No. 5,902,703 of Leroux et al. relates generally to the field of fabricating integrated circuits and more particularly to maintaining accuracy in the fabrication of such circuits having relatively narrow line elements such as gate lines. The invention is also directed to the verification of stepper lens fabrication quality.

U.S. Pat. No. 5,976,741 of Ziger et al. relates generally to methods of determining illumination exposure dosages and other processing parameters in the field of fabricating integrated circuits. More particularly, the invention concerns methods of processing semiconductor wafers in step and repeat systems.

U.S. Pat. No. 6,301,008 B1 of Ziger et al. relates to semiconductor devices and their manufacture, and more particularly, to arrangements and processes for developing relatively narrow line widths of elements such as gate lines, while maintaining accuracy in their fabrication.

U.S. Patent Application US 2002/0182516 A1 of Bowes relates generally to metrology of semiconductor manufacturing processes. More particularly, the present invention is a needle comb reticle pattern for simultaneously making critical dimension (CD) measurements of device features and registration measurements of mask overlays relative to semiconductor wafers during processing of semiconductor wafers. This reference and those previously cited are herein incorporated by reference in their entirety.

Lens aberrations limit the quality of reproducing a mask pattern into a photo resist. A significant type of lens aberrations is flare in which stray light can distort printed features. Flare can vary widely from stepper to stepper even from lenses of the same stepper family. In the manufacture of semiconductors, it is important to be able to assess the effect of flare due to various exposure tools. In general, flare degrades resist profiles by exposing regions that otherwise should remain underexposed. There is a need for quantifying the effects of flare so that the user may take action to minimize these effects so that product yield is increased and costs may be lowered.

In an example embodiment, in a photo lithography process on a photo resist coated substrate, there is a method for determining the effect of flare on line shortening. The method comprises printing a dark-field mask at a first die position on the substrate and in a first exposure. The dark-field mask includes a flare pattern corresponding to one corner of the dark-field mask, a correction box opening, and a focus box pattern on the substrate. In a second exposure, the method prints a clear-field mask including another flare pattern corresponding to an opposite corner of the clear-field mask. At a second die position on the substrate, a composite mask pattern based on features of the dark-field mask and the light field mask is printed. The printed patterns are developed and measurements are obtained from the printed patterns. As a function of the measurements, the effect of flare is determined. A feature of this embodiment further comprises, measuring the dimensions of the flare box pattern of features printed with the dark-field mask and features printed with the clear-field mask, measuring the dimensions of the correction box features printed during the first exposure and features printed during the second exposure, and measuring the dimensions of the focus box pattern printed at the second die position.

In another example embodiment, in a photo-lithography process on a photo resist coated substrate, there is a method for determining the effect of flare on line shortening. The method comprises, printing a first mask including a flare pattern corresponding to one corner of the first mask, at a first die position on the substrate and in a first exposure; in a second exposure, a second mask including another flare pattern corresponding to an opposite corner of the second mask, is printed. At a second die position on the substrate, a composite mask pattern based on features of the first mask and the second mask is printed. The printed patterns are developed and measurements are obtained from the printed patterns. As a function of the measurements, the effect of flare is determined.

In yet another embodiment, there is a system within a stepper apparatus, in a photo lithography process on a photo resist coated substrate, for determining the effect of flare on line shortening. The system comprises means for printing, at a first die position on the substrate and in a first exposure, a first mask that includes a flare pattern corresponding to one corner of the first mask, and in a second exposure, means for printing a second mask that includes another flare pattern corresponding to an opposite corner of the second mask. At a second die position on the substrate, there are means for printing a composite mask pattern based on features of the first mask and second mask. There are means for developing the printed patterns and obtaining measurements from the printed patterns. As a function of the measurements, there are means for determining the effect of flare.

In yet another embodiment, there is a mask set for use in a wafer stepper. The mask set comprises a first mask having features of predetermined dimensions laid out in a dark-field and a second mask having features of predetermined dimensions laid out in a clear-field. Included in the first mask, the features are comprised of a first portion of a flare pattern, a first portion of a box-in-a-box correction pattern, and a first portion of a focus box pattern. Included in the second mask, the features are comprised of a second portion of the flare pattern, a second portion of the box-in-a-box correction pattern, the second portion of the box-in-a-box correction pattern alignable to the first portion of the box-in-a-box correction pattern, and a second portion of the focus box pattern, the second portion of the focus box pattern alignable to the first portion of the focus box pattern. An additional feature of this embodiment, is that a the mask set further comprises a third mask having features of predetermined dimensions, wherein the features are defined by the combination of the features of the first mask and the features of the second mask.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

The present invention has been found to be useful for quantifying the effects of flare in reproducing a mask pattern onto a photo resist coated substrate.

Figure 1:
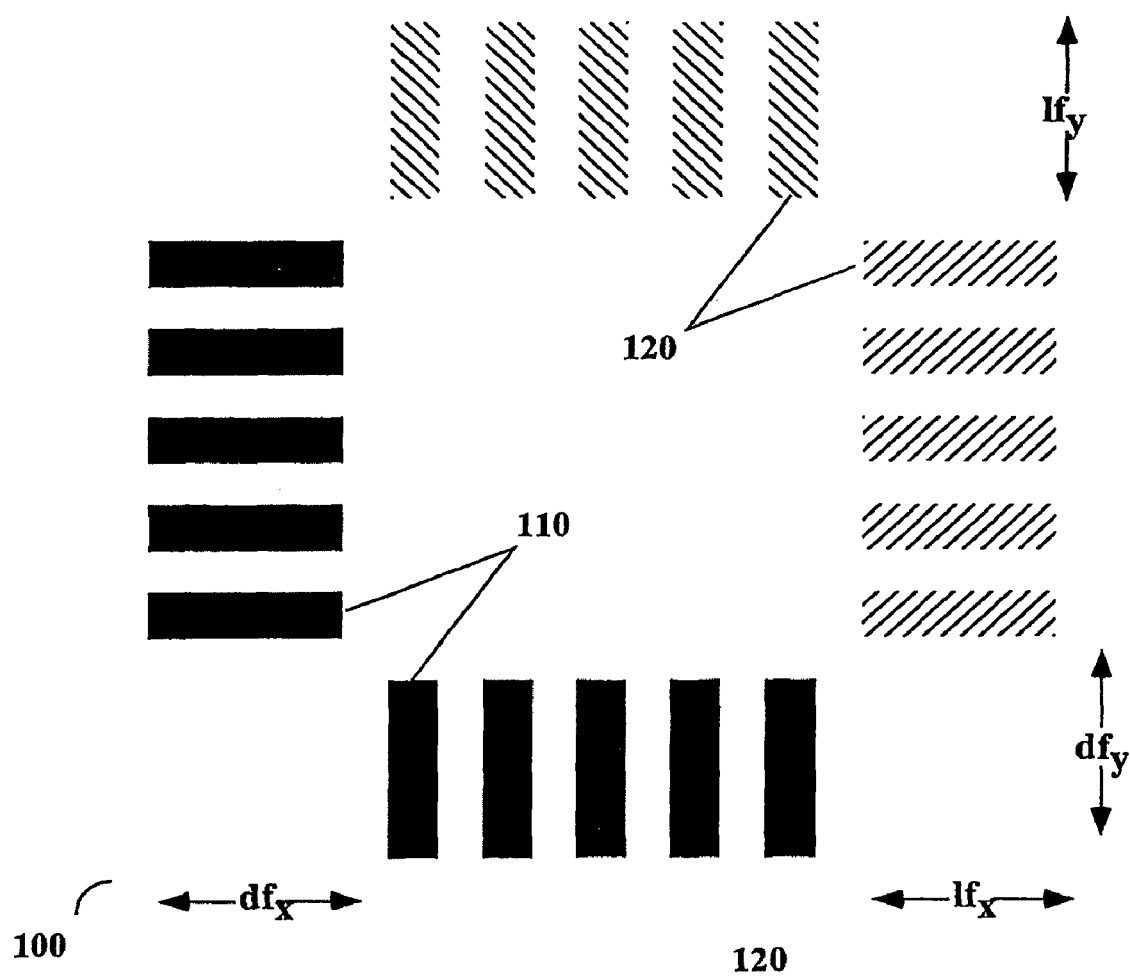
FIG. 1 depicts a composite grating box used for calculating flare according to an embodiment of the present invention.

Refer to FIG. 1. In an example embodiment according to the present invention, a modified box-in-a-box structure 100 is constructed using two masks, a sparse (clear-field) mask that is sensitive to flare and a dense (dark-field) mask that is far less sensitive to flare. To enhance the effect of flare, the sides of the box-in-a-box are composed of grating structures. The left and bottom elements 110 are exposed using a dark-field mask. The top and right elements 120 are exposed from a clear-field mask.

In an example embodiment, the user may assume that the masking can be done such that there is negligible overlay error for exposing two masks to attain the elements 110 and 120. The apparent misalignment is a relative measure of the effect of flare line length shortening. It is expected that the elements 120 exposed with the clear-field mask are somewhat shorter than those elements 110 exposed with the dark-field mask. In performing optical length measurements, $df_x$ is the field optical length measurement of the part of the box structure exposed with the dark field mask; $lf_x$ is the corresponding optical length measurement of the part of the box exposed with the light field mask. Likewise, the corresponding optical length measurements in the y-direction are $df_y$ and $lf_y$.

Figure 2A:
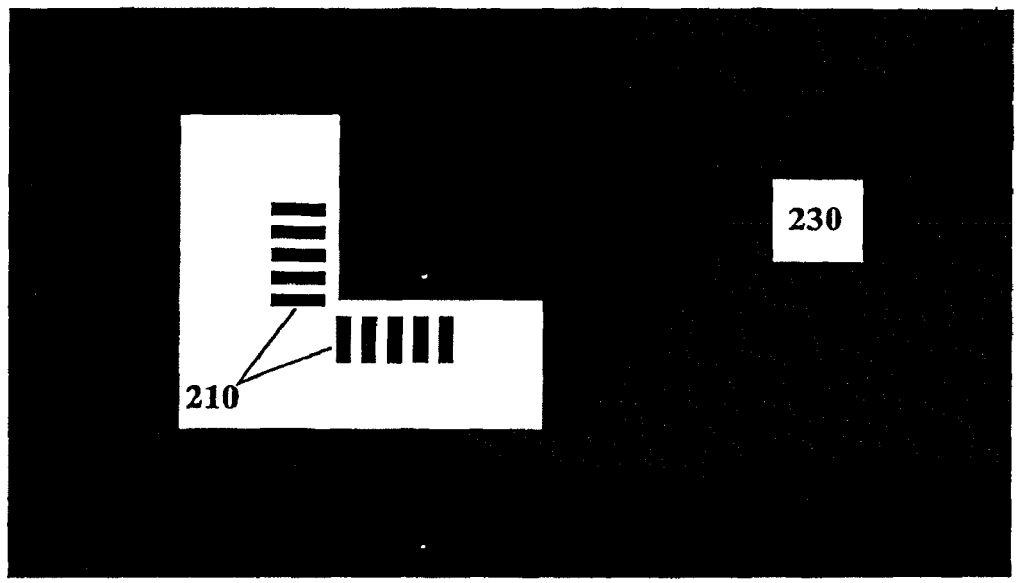
FIG. 2A is a dark-field mask used in the printing of the composite grating box of FIG. 1.
Figure 2B:
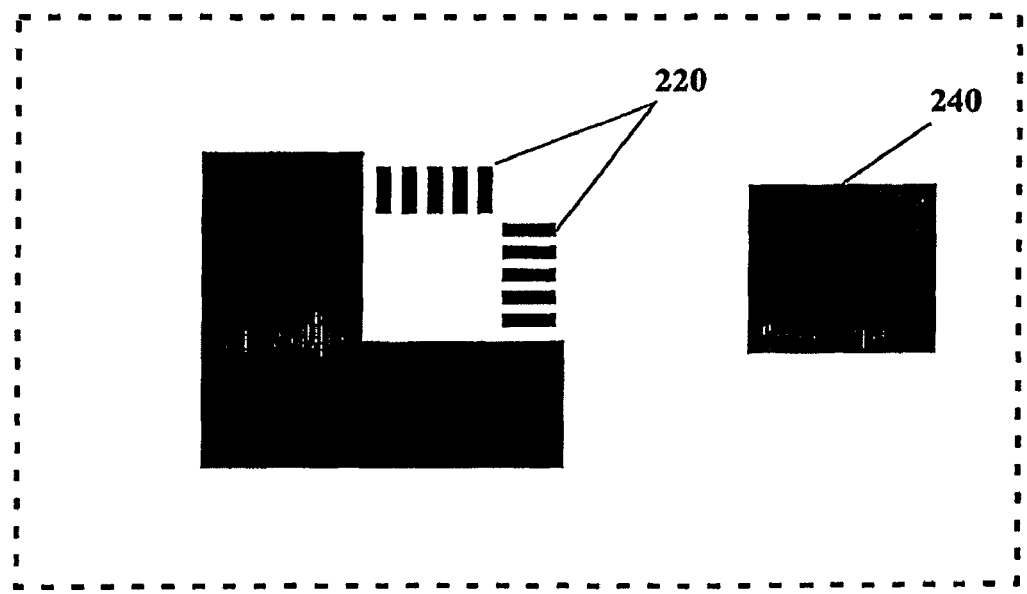
FIG. 2B illustrates a light-field mask used in combination with the dark-field mask of FIG. 2A to print the composite grating box of FIG. 1

There are two errors with calculating flare using the structure of FIG. 1. First, there is always some misalignment when interchanging two different masks to attain elements 110 and 120. This may be corrected by constructing a correction box, a box-in-a-box pattern from the two masks. Refer to FIGS. 2A-2B. The dark-field mask 200 is composed of grating structures 210 and an alignment box 230. The clear-field mask 205 is composed of grating structure 220 and another alignment box 240. In using these masks on a photo resist coated substrate, the user may print the dark-field pattern of FIG. 2A. The clear-field pattern of FIG. 2B is aligned to the print of FIG. 2A with the two alignment boxes 230 and 240. The resulting pattern 215 of FIG. 2C produces the flare pattern of grating structures 210 and 220 and a box-in-a-box alignment patter 250 (boxes 230 and 240). The measurement of interest is the width of each side. Differences in the left and right or top and bottom are the sum of the misalignment between the two masks and any flare differences. We can subtract the effect of mask overlay with the standard box-in-box.

Figure 3:
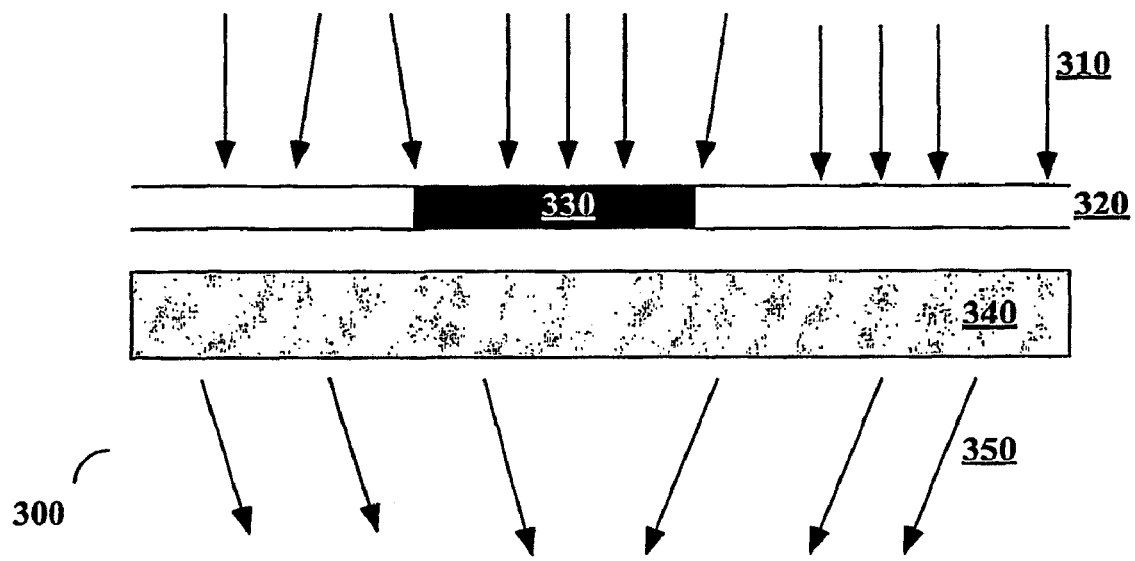
FIG. 3 depicts the scattering of light passing through a mask feature and the stepper lens.
Figure 5A:
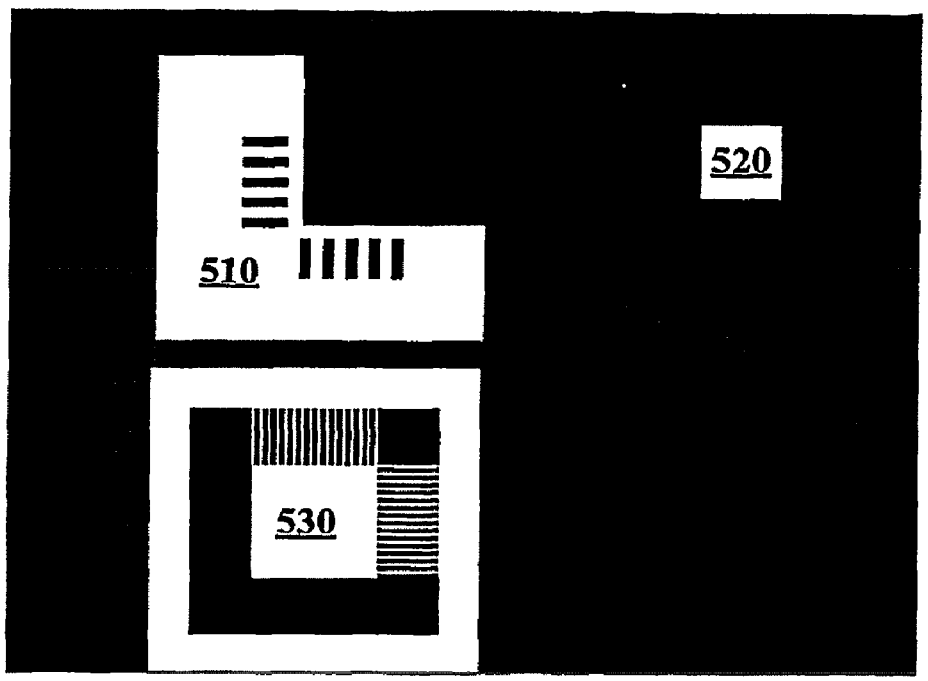
FIG. 5A depicts a dark-field mask incorporating the focus-box pattern of FIG. 4.
Figure 5B:
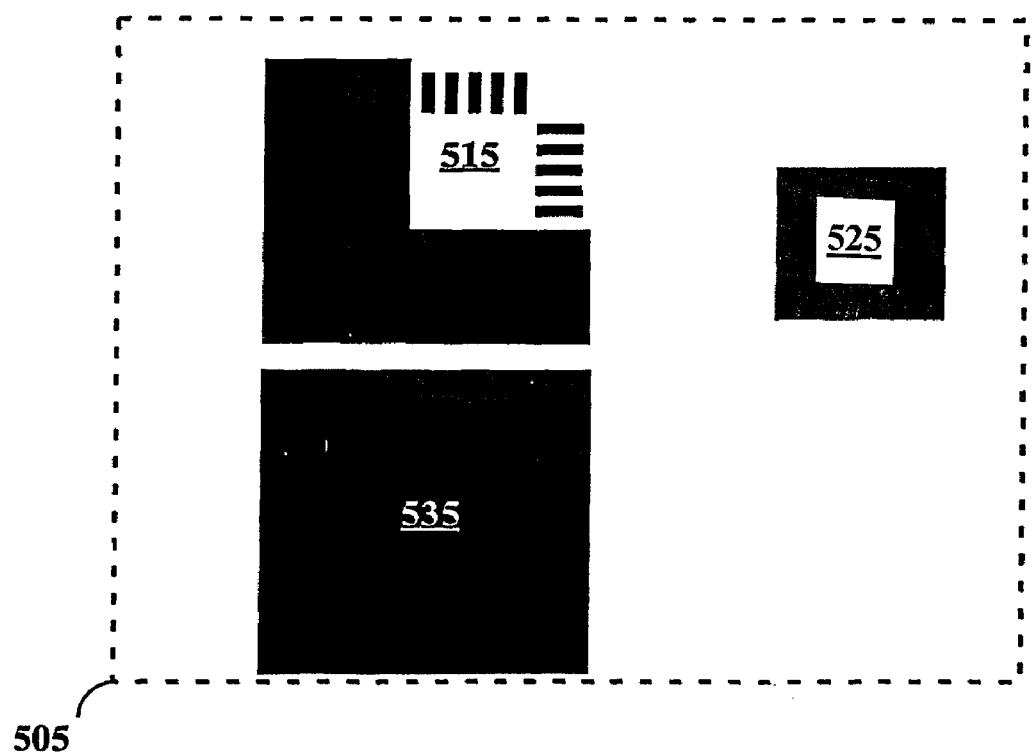
FIG. 5B depicts a light field mask used in conjunction with the mask depicted in FIG. 5A.

A second potential error that may be encountered is due to long range flare effects in which scattered light exposes those areas masked off. Refer to FIG. 3. In the arrangement 300, light 310 is projection through a mask 320 having a defined designed feature 330. Aberrations in lens 340 scatter the light 310b. This scattering may cause the printed features to be larger than those designed. In an extreme, example, the scattered light would evenly expose areas under the masked regions. One of the assumptions being made is that regions under the chrome are not exposed. The effect of long-range flare is worse with the light field mask. Refer to FIG. 5. For example, the procedure is to expose FIG. 5A and then FIG. 5B. We assume that the left and bottom regions which are masked off area (the thick "L" of the 515 structure), remain completely unexposed.

Figure 4:
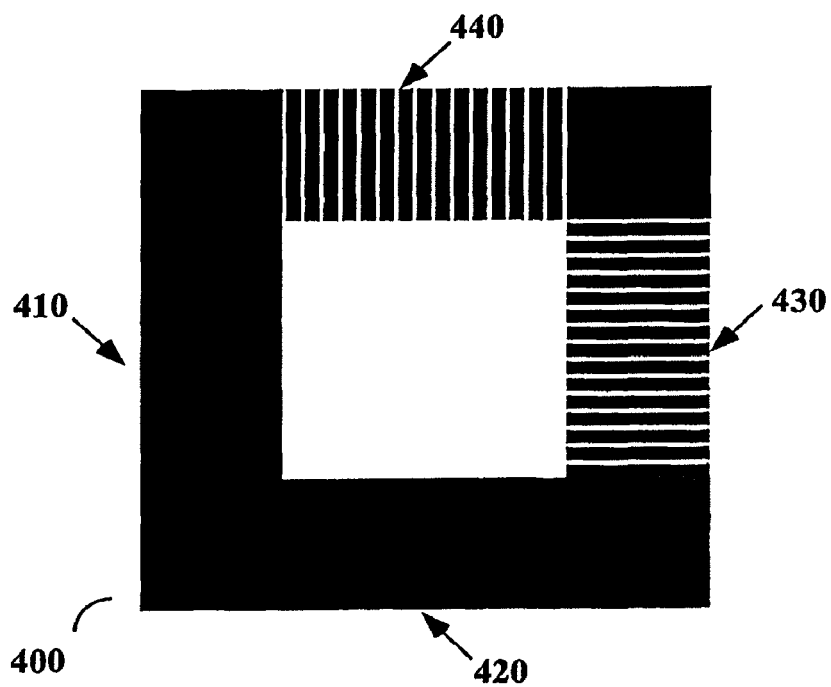
FIG. 4 depicts a dark-field focus box pattern

A correction scheme according to an embodiment of the present invention may be used to quantify this error. Refer to FIG. 4. 1). One or more stepper fields are exposed with a focus box pattern 400 using a dark-field mask. The focus box pattern 400 is composed of solid regions 410, 420 and lines and spaces 430, 440 in the x and y-direction. 2). The same pattern is exposed in a region that has been masked off in a prior clear-field exposure. 3). The correction for prior exposure due to flare is the difference in line shortening between the focus box structure in the single exposed field and the doubly exposed field.

Figure 2C:
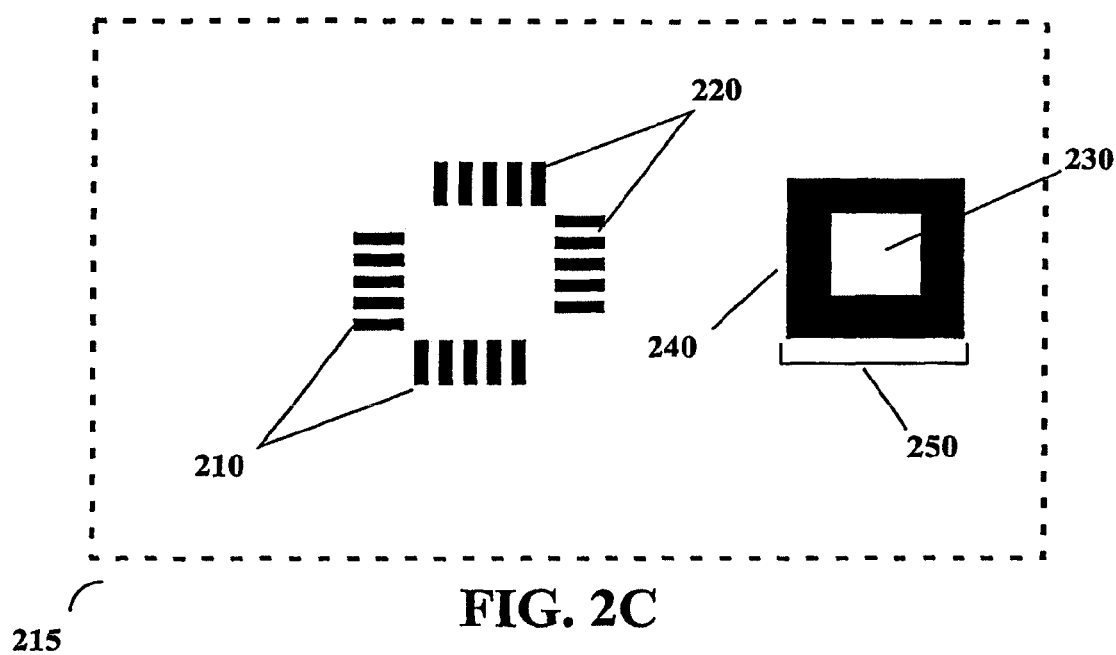
FIG. 2C depicts the combination of the masks of FIGS. 2A and 2B according to an embodiment of the present invention.
Figure 5C:
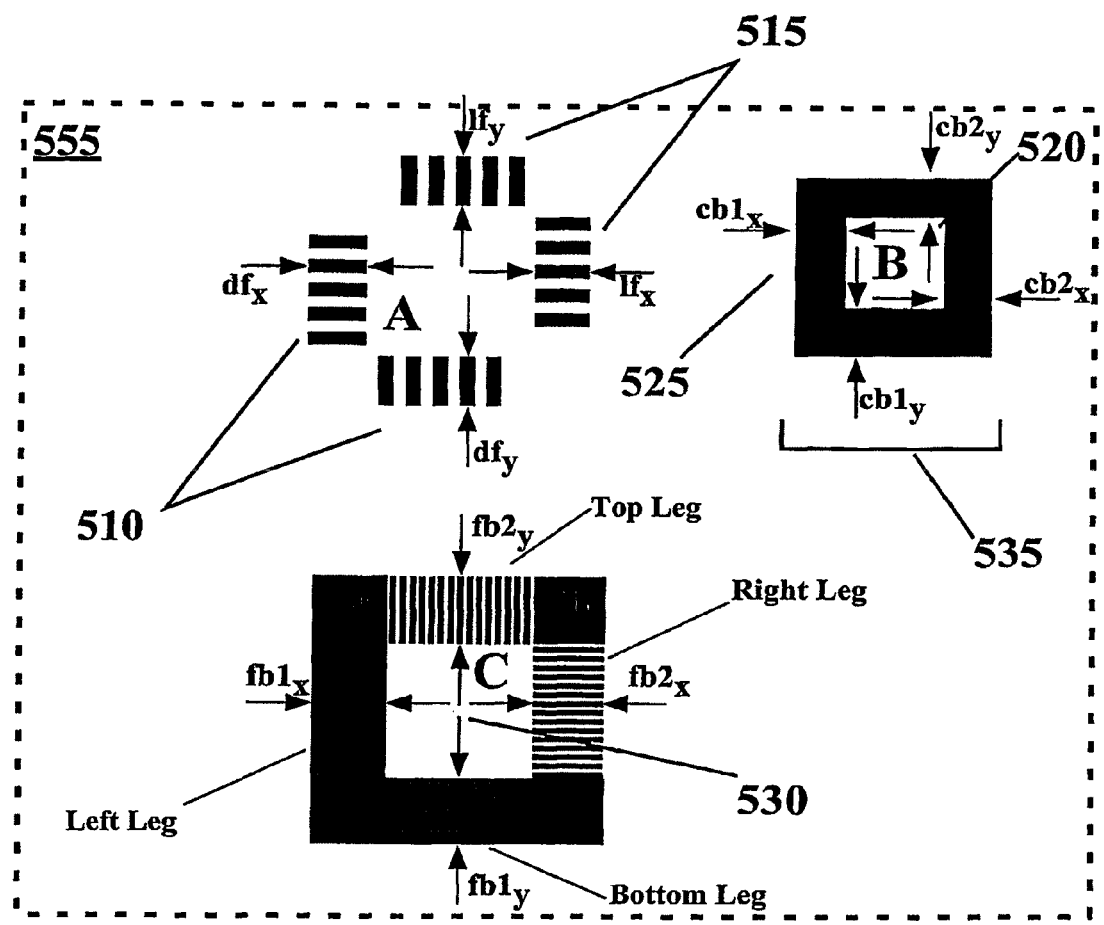
FIG. 5C illustrates the combination of masks shown in FIGS. 5A and 5B.

According to another embodiment of the present invention, the focus box pattern of FIG. 4 may be incorporated into the flare measurement structure of FIGS. 2A-2C. Refer to FIGS. 5A-5C. A dark-field mask 500 is composed of part of a flare pattern 510, an alignment box 520 and a focus box pattern 530. A corresponding clear-field mask 505 is composed of another alignment box 525 (which aligns to alignment box 520), the region defined by focus box pattern 530 is blocked out by region 535. The printed composite structure, FIG. 5C is the combination of dark field mask 500 and clear-field mask 505. Patterns 510 and 515 make the flare pattern ("A"). The correction box ("B") 535, and focus box ("C") pattern 530 are the combination of the dark field mask 500 and light-field mask 505.

Figure 6:
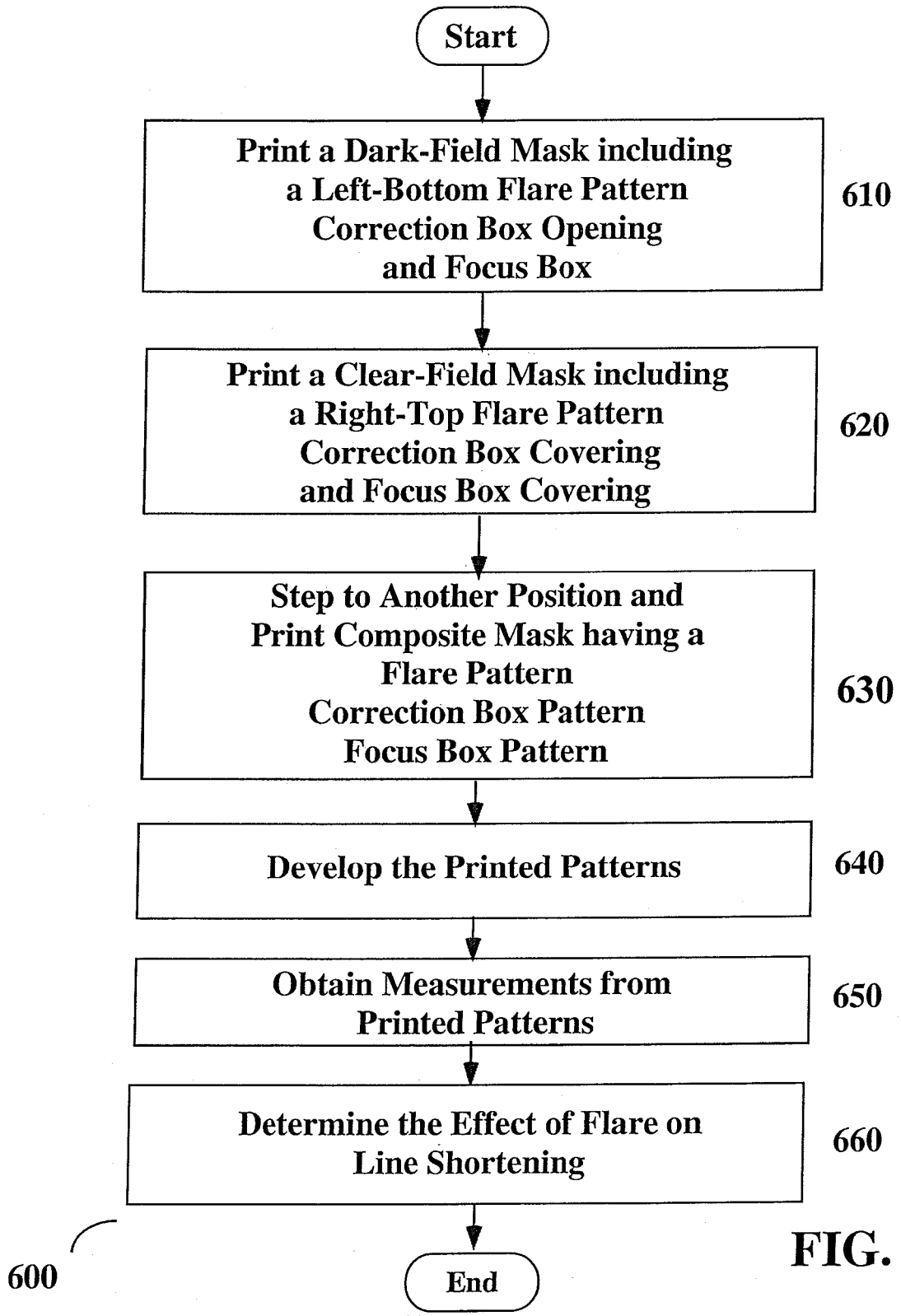
FIG. 6 is a flowchart of an example process according to the present invention.

Refer to FIG. 6. In an example embodiment, in a wafer-stepper apparatus, upon a resist-coated substrate, the user may print the dark-field mask pattern 610 of FIG. 5A. Overlaid upon the exposed FIG. 5A pattern, the user may print the clear-field mask pattern 620 of FIG. 5B. The resist coated-coated substrate has undergone a double-exposure for the FIG. 5A and FIG. 5B masks. Having printed FIG. 5A and FIG. 5B mask patterns as a double-exposure, the user steps to another location on the substrate and prints the composite mask pattern 630 of FIG. 5C. The printed pattern is developed 640. The user obtains measurements from the printed pattern 650. After obtaining the measurements, the user may determine the effect of flare 660 on line shortening.

Figure 7:
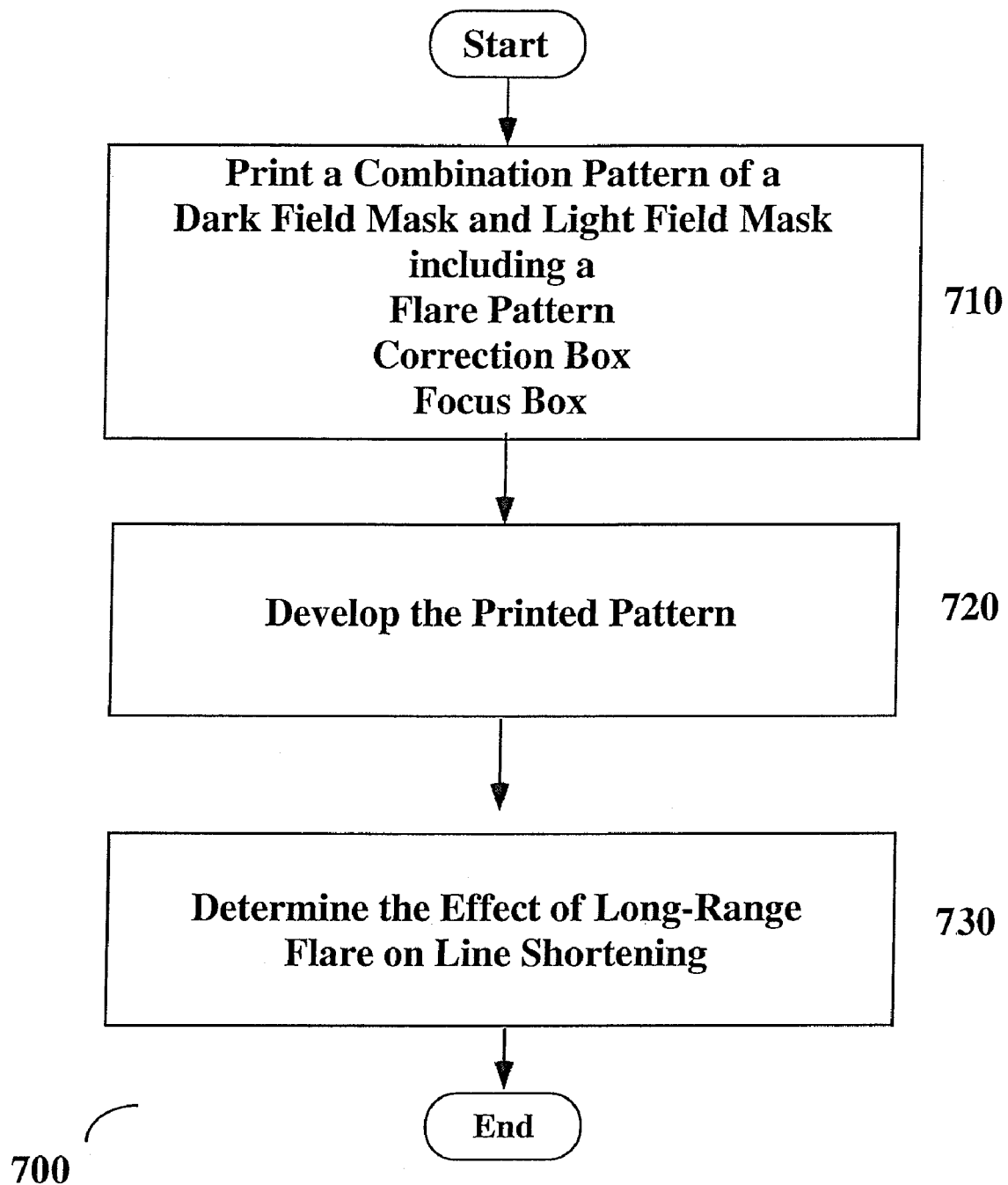
FIG. 7 is a flowchart of another example process according to the present invention.

Refer to FIG. 7. In another example embodiment, on a substrate, the user may print the combination mask pattern of FIGS. 5A and 5B, as depicted in FIG. 5C in a single exposure. The user prints the combination pattern 710 which includes the flare pattern (510, 515), correction box (535), and focus box (530). The printed pattern is developed 720. The effect of long-range flare on line shortening 730 is determined.

For more information on the measuring of process induced line-shortening, refer to provisional U.S. Patent Application No. 60/468,892 titled, "Overlay Box Structure for Measuring Process-Induced Line Shortening Effect," of Yuji Yamaguchi and Pierre Leroux, the application being assigned to Koninklijke Philips Electronics N.V. of The Netherlands, the application is incorporated by reference in its entirety.

Further information on the measuring of lines and spaces may be found in provisional U.S. Patent Application No. 60/468,893 titled, "A Method and Lithographic Structure for Measuring Lengths of Lines and Spaces," of Yuji Yamaguchi, the application being assigned to Koninklijke Philips Electronics N.V. of The Netherlands, the application is incorporated by reference in its entirety.

In taking measurements upon the composite structure of FIG. 5C printed on a wafer substrate, a general calculation for the effect of flare on line shortening of horizontal features is denoted by, "R" the measured registration reported by the alignment-measuring patterns, as depicted in FIG. 5C. For example, in the structures A, B, C, the general expression of misalignment is represented by:

$$R_x = \text{(right leg–left leg)}/2 \quad (1)$$

$$R_y = \text{(top leg–bottom leg)}/2 \quad (2)$$

In an example embodiment according to the present invention, the user may determine the degree of misalignment in the "B" structure 535 between the overlay FIG. 5A and FIG. 5B in the x-direction where the misalignment is the difference in width between the structure's left leg ($cb1_x$) and right leg ($cb2_x$) and in the y-direction where the misalignment is the difference between the bottom leg ($cb1_y$) and the top leg ($cb2_y$).

Likewise, the user may determine the degree of misalignment in the "A" structure between the light-field features 515 and dark-field features 510. The apparent misalignment in the x-direction, between the light/dark field features is the difference in width between the structure's left leg ($df_x$) and right leg ($lf_x$) and the apparent misalignment in the y-direction between the light/dark field features is the difference in width between the structure's top leg ($lf_y$) and bottom leg ($df_y$).

The user may compare the line shortening between the "C" structure 530 in the single versus double exposed fields where line shortening in the x-direction, is the difference in width between the left leg ($fb1_x$) and right leg ($fb2_x$) or in the y-direction, the top leg ($fb2_y$) and bottom leg ($fb1_y$). The intermediate results of the calculations determined from the three structures, is used to calculate the flare.

$$ls_x^{Flare} = r_x^{lf\text{-}df} - r_x^{1st\text{-}2nd\ mask} - r_x^{Multiple\text{-}Single\ Exposure} \quad (3)$$

$$ls_y^{Flare} = r_y^{lf\text{-}df} - r_y^{1st\text{-}2nd\ mask} - r_y^{Multiple\text{-}Single\ Exposure} \quad (4)$$

where $r_x^{lf\text{-}df}$, $r_x^{1st\text{-}2nd\ mask}$ and $r_x^{Multiple\text{-}Single\ Exposure}$ are the measured misalignments in the x direction for the light field/dark field structures (A), the standard box in box (B) that measures the alignment between the two exposures and the measured difference between the focus box structure (C) exposed twice versus a single time.

where $r_x^{lf\text{-}df}$, $r_x^{1st\text{-}2nd\ mask}$ and $r_x^{Multiple\text{-}single}$ Exposure are the measured misalignments in the x direction for the light field/dark field structures (A), the standard box in box (B) that measures the alignment between the two exposures and the measured difference between the focus box structure (C) exposed twice versus a single time.

In a particular example process, the techniques according to the present invention may be applied. The alignment tool reports $r_x$ and $r_y$ which are the differences in left leg and right leg or top leg and bottom leg optical width measurements. By overlapping FIG. 5A and FIG. 5B, the image of FIG. 5C is rendered. Also, one may assume that the pattern shown in 5C is exposed on another stepper field. Table 1 outlines the example values obtained.

TABLE 1

Example Data to Determine Flare

| Structure | rx | | ry | |
|---|---|---|---|---|
| | Overlapped 5A/5B | 5C | Overlapped 5A/5B | 5C |
| A | 0.013 | | 0.013 | |
| B | 0.005 | | 0.005 | |
| C | 0.152 | 0.150 | 0.183 | 0.181 |

Flare in x direction
$1s_x^{flare} = 0.013 - 0.005 - (0.152 - 0.150)$
Flare in y direction
$1s_y^{flare} = 0.013 - 0.005 - (0.183 - 0.181)$ While the present invention has been described with reference to several particular example embodiments, those skilled in the art will recognize that many changes may be made thereto without departing from the spirit and scope of the present invention, which is set forth in the following claims.

What is claimed is:

1. In a photo lithography process on a photo resist coated substrate, a method for determining the effect of flare on line shortening, the method comprising:
   in a first exposure at a first die position on the substrate, printing on the substrate a dark-field mask including a first portion of a flare pattern corresponding to a corner of the dark-field mask, a first portion of a box-in-a-box correction pattern, and a first portion of a focus box pattern, and
   in a second exposure at the first die position, printing on the substrate a clear-field mask including a second portion of the flare pattern corresponding to a corner of the clear-field mask, a second portion of the box-in-a-box correction pattern, and a second portion of the focus box pattern;
   at a second die position on the substrate, printing on the substrate a composite mask pattern based on features of the dark-field mask and the clear-field mask;
   developing the printed patterns and obtaining measurements therefrom; and
   determining the effect of flare, including line shortening, as a function of the measurements.

2. The method of claim 1, wherein the measurements include measurements in both X and Y directions, and wherein the step of obtaining measurements includes
   measuring dimensions of features of the flare pattern printed with the dark-field mask and of features of the flare pattern printed with the clear-field mask;
   measuring dimensions of features of the box-in-a-box correction pattern printed during the first exposure and of features of the box-in-a-box correction pattern printed during the second exposure; and
   measuring dimensions of the focus box pattern printed during the first exposure and measuring dimensions of the composite mask pattern printed on the substrate at the second die position.

3. The method of claim 2, wherein the step of obtaining measurements includes taking measurements from a left-leg and a right-leg of the printed features and taking measurements from a top-leg and bottom-leg of printed features.

4. The method of claim 2, wherein the second portion of the flare pattern printed on the substrate is aligned with the first portion of the flare pattern, the second portion of the box-in-a-box correction pattern printed on the substrate is aligned with the first portion of a box-in-a-box correction pattern, the second portion of the focus box pattern printed on the substrate is aligned with the first portion of a focus box pattern, and the corner of the dark-field mask is located opposite the corner of the clear-field mask.

5. The method of claim 2, wherein the step of obtaining measurements further includes measuring the composite mask pattern at locations on the substrate defined by features of the first mask and features of the second mask.

6. The method of claim 1, wherein the measurements include measurements in both X and Y directions, and wherein the corner of the dark-field mask is located opposite the corner of the clear-field mask.

7. In a photo lithography process on a photo resist coated substrate, a method for determining the effect of flare on line shortening, the method comprising:
   in a first exposure at a first die position on the substrate, printing on the substrate a first mask including a portion of a flare pattern corresponding to a corner of the first mask;
   in a second exposure at the first die position, printing on the substrate a second mask including another portion of the flare pattern corresponding to a corner of the second mask;
   at a second die position on the substrate, printing a composite mask pattern based on features of the first mask and the second mask;
   developing the printed patterns and obtaining measurements therefrom; and
   determining the effect of flare, including line shortening, as a function of the measurements.

8. The method of claim 7, wherein the step of obtaining measurements includes
   measuring the flare pattern corresponding to the corner of the first mask; and
   measuring the flare pattern corresponding to the corner of the second mask, wherein the corner of the first mask is located opposite the corner of the second mask, and the measurements include measurements in both X and Y directions.

9. The method of claim 8, wherein the step of obtaining measurements further includes measuring the composite mask pattern at locations on the substrate defined by features of the first mask and features of the second mask.

10. The method of claim 7, wherein the step of printing in the first exposure at the first die position further includes printing on the substrate the first mask including a portion of a box-in-a-box correction pattern and a portion of a focus box pattern, and the step of printing in the second exposure at the first die position further includes printing on the substrate the second mask including another portion of the box-in-a-box correction pattern and another portion of the focus box pattern.

11. The method of claim 10, wherein the other of the flare pattern printed on the substrate in the second exposure is aligned with the portion of the flare pattern printed on the substrate in the first exposure, the other portion of the box-in-a-box correction pattern printed on the substrate in the second exposure is aligned with the portion of a box-in-a-box correction pattern printed on the substrate in the first exposure, and the other portion of the focus box pattern printed on the substrate in the second exposure is aligned with the portion of a focus box pattern printed on the substrate in the first exposure.

12. A mask set for use in a wafer stepper, the mask set comprising:
   a first mask having features of predetermined dimensions laid out in a dark-field, the features of the first mask including a first portion of a flare pattern, a first portion of a box-in-a-box correction pattern, and a first portion of a focus box pattern;

a second mask having features of predetermined dimensions laid out in a light-field, the features of the second mask including a second portion of the flare pattern, a second portion of the box-in-a-box correction pattern that is alignable to the first portion of the box-in-a-box correction pattern, and a second portion of the focus box pattern that is alignable to the first portion of the focus box pattern wherein the focus box and box-in-a-box features are provided by disparate patterns.

13. The mask set of claim 12, further comprising a third mask having features of predetermined dimensions, wherein the features are defined by the combination of the features of the first mask and the features of the second mask.

* * * * *